(12) United States Patent
Yu et al.

(10) Patent No.: US 12,376,505 B2
(45) Date of Patent: Jul. 29, 2025

(54) RESISTIVE MEMORY DEVICE AND METHOD FOR MANUFACTURING THE SAME

(71) Applicant: UNITED MICROELECTRONICS CORP., Hsinchu (TW)

(72) Inventors: Shu-Hung Yu, Kaohsiung (TW); Chun-Hung Cheng, Kaohsiung (TW); Chuan-Fu Wang, Miaoli County (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 652 days.

(21) Appl. No.: 17/747,000

(22) Filed: May 18, 2022

(65) Prior Publication Data
US 2023/0337556 A1 Oct. 19, 2023

(30) Foreign Application Priority Data
Apr. 18, 2022 (TW) ................... 111114682

(51) Int. Cl.
*H10N 70/00* (2023.01)
*H10N 70/20* (2023.01)
(52) U.S. Cl.
CPC ......... *H10N 70/823* (2023.02); *H10N 70/028* (2023.02); *H10N 70/063* (2023.02); *H10N 70/20* (2023.02); *H10N 70/826* (2023.02); *H10N 70/24* (2023.02); *H10N 70/841* (2023.02); *H10N 70/8833* (2023.02)

(58) Field of Classification Search
CPC .. H10N 70/24; H10N 70/8833; H10N 70/826; H10N 70/823; H10N 70/20
See application file for complete search history.

(56) References Cited

U.S. PATENT DOCUMENTS

| | | | |
|---|---|---|---|
| 9,336,870 B1 | 5/2016 | Mickel et al. | |
| 10,361,368 B2 | 7/2019 | Ando et al. | |
| 2013/0149815 A1* | 6/2013 | Murase | H10N 70/011 438/104 |
| 2020/0066340 A1* | 2/2020 | Sharma | H10N 70/046 |

FOREIGN PATENT DOCUMENTS

CN 105655486 A 6/2016

OTHER PUBLICATIONS

Office Action issued by Taiwan Intellectual Property Office on Apr. 23, 2025.

* cited by examiner

*Primary Examiner* — Jose R Diaz
(74) *Attorney, Agent, or Firm* — WPAT, PC

(57) ABSTRACT

A resistive memory device is provided. The resistive memory device includes a first electrode, a memory structure on the first electrode, and a second electrode on the memory structure. The memory structure includes a tubular element and a pillar element. The tubular element includes oxide. The pillar element includes oxide. The pillar element is surrounded by the tubular element. The tubular element and the pillar element include different materials.

20 Claims, 5 Drawing Sheets

RESISTIVE MEMORY DEVICE AND METHOD FOR MANUFACTURING THE SAME

This application claims the benefit of Taiwan application Serial No. 111114682, filed Apr. 18, 2022, the subject matter of which is incorporated herein by reference.

BACKGROUND

Technical Field

The present disclosure relates to a memory device and a method for manufacturing the same, and more particularly to a resistive memory device and a method for manufacturing the same.

Description of the Related Art

A resistive memory device utilizes an oxide material in a memory structure. The oxide material can change the resistance between two or more resistance ranges. The resistance ranges correspond to different data states respectively. However, there are still several important issues unaddressed in the development of resistive memory devices, among which, how to improve endurance and retention time of the memory device while reducing chip size is a big concern.

It is important to provide technology for resistive memory devices with high endurance, long retention time and small size.

SUMMARY

The present disclosure relates to a resistive memory device and a method for manufacturing the same.

According to an embodiment of the present disclosure, a resistive memory device is provided. The resistive memory device includes a first electrode, a memory structure on the first electrode, and a second electrode on the memory structure. The memory structure includes a tubular element and a pillar element. The tubular element includes oxide. The pillar element includes oxide. The pillar element is surrounded by the tubular element. The tubular element and the pillar element include different materials.

According to another embodiment of the present disclosure, a method for manufacturing a resistive memory device is provided. The method includes the following steps. Providing a first electrode. Forming a tubular element and a pillar element on the first electrode through an annealing step, wherein the tubular element includes oxide, the pillar element includes oxide, the pillar element is surrounded by the tubular element, the tubular element and the pillar element include different materials. Forming a second electrode on the tubular element.

The above and other embodiments of the disclosure will become better understood with regard to the following detailed description of the non-limiting embodiment(s). The following description is made with reference to the accompanying drawings.

DETAILED DESCRIPTION

Figure 1:
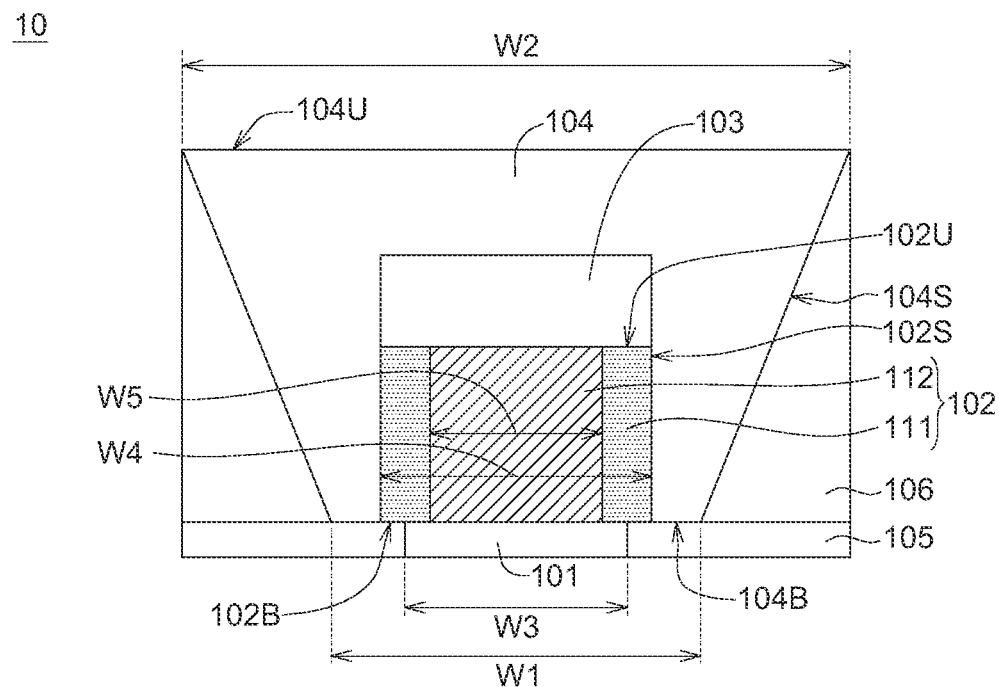
FIG. 1 illustrates a schematic sectional view of a resistive memory device according to an embodiment of the present disclosure.

Various embodiments will be described more fully hereinafter with reference to accompanying drawings, which are provided for illustrative and explaining purposes rather than a limiting purpose. For clarity, the components may not be drawn to scale. In addition, some components and/or reference numerals may be omitted from some drawings. It is contemplated that the elements and features of one embodiment can be beneficially incorporated in another embodiment without further recitation.

Referring to FIG. 1, FIG. 1 illustrates a schematic sectional view of a resistive memory device 10 according to an embodiment of the present disclosure. The resistive memory device 10 includes a first electrode 101, a memory structure 102 on the first electrode 101, a hard mask layer 103 on the memory structure 102, a second electrode 104 on the memory structure 102, an insulating layer 105 and a dielectric layer 106.

The first electrode 101 may be in the insulating layer 105. The first electrode 101 and the insulating layer 105 are on a lower surface 102B of the memory structure 102. The second electrode 104 is on a sidewall 102S of the memory structure 102. The hard mask layer 103 is on an upper surface 102U of the memory structure 102, and the upper surface 102U of the memory structure is opposite to the lower surface 102B of the memory structure 102. The hard mask layer 103 may be between the second electrode 104 and the memory structure 102. In an embodiment, the second electrode 104 is on the first electrode 101 and the insulating layer 105 and covering the memory structure 102 and the hard mask layer 103. The dielectric layer 106 may be on a sidewall 104S of the second electrode 104. In an embodiment, the dielectric layer 106 surrounds the second electrode 104.

Figure 2:
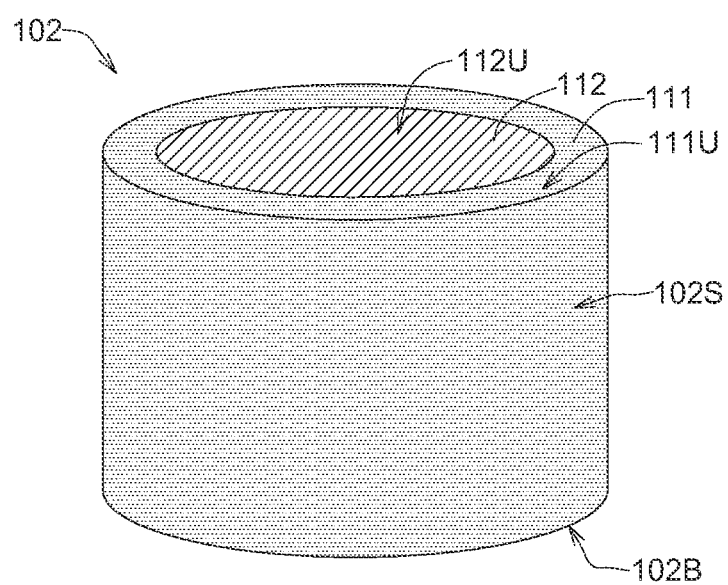
FIG. 2 illustrates a schematic stereoscopic view of a memory structure of a resistive memory device according to an embodiment of the present disclosure.

Referring to FIGS. 1-2, FIG. 2 illustrates a schematic stereoscopic view of a memory structure 102 of a resistive memory device 10 according to an embodiment of the present disclosure. The memory structure 102 may include a tubular element 111 and a pillar element 112. The tubular element 111 may have a tubular shape with two open ends. The pillar element 112 may be surrounded by the tubular element 111. In an embodiment, the memory structure 102 may have a structure similar to a coaxial cable. In an embodiment, an upper surface 111U of the tubular element 111 is coplanar with and an upper surface 112U of the pillar element 112. The hard mask layer 103 may directly contact the upper surface 111U of the tubular element 111 and the upper surface 112U of the pillar element 112. The first electrode 101 may directly contact the tubular element 111. During the operation of the resistive memory device 10, such as the program operation of the resistive memory device 10, an operation voltage applied to the resistive memory device 10 may induce conductive filament in the resistive memory device 10, the conductive filament may be in the tubular element 111 and between the second electrode 104 and the pillar element 112, thereby changing resistance state of the memory structure 102.

The second electrode 104 has a lower surface 104B and an upper surface 104U opposite to the lower surface 104B. For example, the lower surface 104B of the second electrode 104 faces toward the first electrode 101. The lower surface 104B of the second electrode 104 has a width W1. The upper surface 104U of the second electrode 104 has a width W2. In this embodiment, the width W1 of the lower surface 104B of the second electrode 104 is less than the width W2 of the upper surface 104U of the second electrode 104. The first electrode 101 has a width W3. The tubular element 111 has a width W4. The pillar element 112 has a width W5. The width W3 of the first electrode may be less than or equal to the width W4 of the tubular element 111. The width W3 of the first electrode may be less than the width W1 of the lower surface 104B of the second electrode 104. The width W3 of the first electrode may be greater than the width W5 of the pillar element 112.

Figure 3:
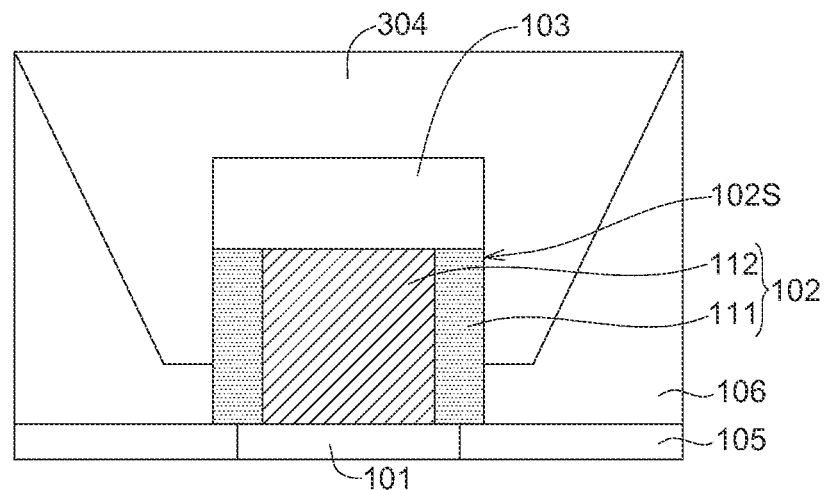
FIG. 3 illustrates a schematic sectional view of a resistive memory device according to an embodiment of the present disclosure.

Referring to FIG. 3, FIG. 3 illustrates a schematic sectional view of a resistive memory device 30 according to an embodiment of the present disclosure. The difference between the resistive memory device 30 shown in FIG. 3 and the resistive memory device 10 shown in FIG. 1 is disclosed with the following description. The second electrode 304 of the resistive memory device 30 may be different from the second electrode 104 of the resistive memory device 10. The second electrode 304 is on the sidewall 102S of the memory structure 102. The second electrode 304 covers part of the sidewall 102S of the memory structure 102. The second electrode 304 may not directly contact the insulating layer 105.

Figure 4:
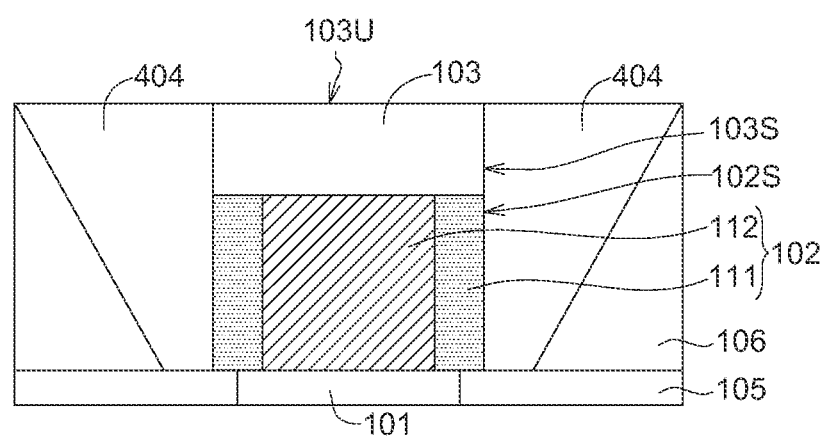
FIG. 4 illustrates a schematic sectional view of a resistive memory device according to an embodiment of the present disclosure.

Referring to FIG. 4, FIG. 4 illustrates a schematic sectional view of a resistive memory device 40 according to an embodiment of the present disclosure. The difference between the resistive memory device 40 shown in FIG. 4 and the resistive memory device 10 shown in FIG. 1 is disclosed with the following description. The second electrode 404 of the resistive memory device 40 may be different from the second electrode 104 of the resistive memory device 10. The second electrode 404 is on the sidewall 102S of the memory structure 102. The second electrode 404 covers the sidewall 102S of the memory structure 102 and a sidewall 103S of the hard mask layer 103. The second electrode 404 may not cover an upper surface 103U of the hard mask layer 103.

FIGS. 5-10 illustrate a method for manufacturing a resistive memory device according to an embodiment of the present disclosure.

Figure 5:
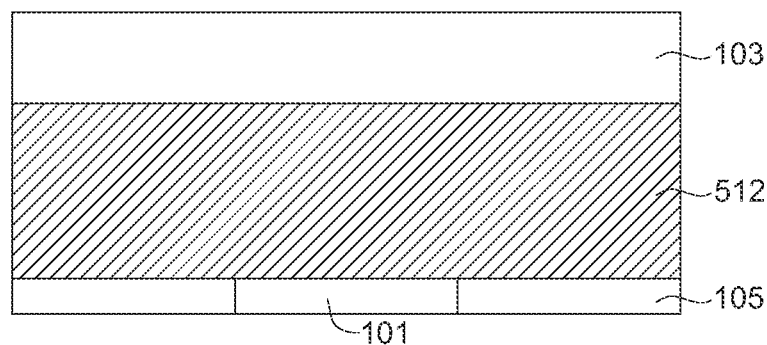
FIGS. 5-10 illustrate a method for manufacturing a resistive memory device according to an embodiment of the present disclosure.

Referring to FIG. 5, a first electrode 101 and an insulating layer 105 are provided. The first electrode 101 may be formed in the insulating layer 105. An oxide material layer 512 and a hard mask layer 103 are formed sequentially on the first electrode 101 and the insulating layer 105. The oxide material layer 512 and the hard mask layer 103 on the oxide material layer 512 may be formed by a deposition process, such as a chemical vapor deposition, plasma-enhanced chemical vapor deposition, atomic layer deposition (ALD), etc. The first electrode 101 may include a conductive material, such as metal, metal nitride, or combinations thereof. In an embodiment, the first electrode 101 includes metal such as titanium, tantalum, copper, tungsten, platinum, iridium, etc. In an embodiment, the first electrode 101 includes metal nitride such as titanium nitride (TiN), tantalum nitride (TaN), etc. The insulating layer 105 may include a dielectric material such as tetraethoxysilane (TEOS) or silicon oxide (SiO). The oxide material layer 512 may include oxide such as tantalum oxide ($TaO_x$). The hard mask layer 103 may include silicon nitride (SiN).

Figure 6:
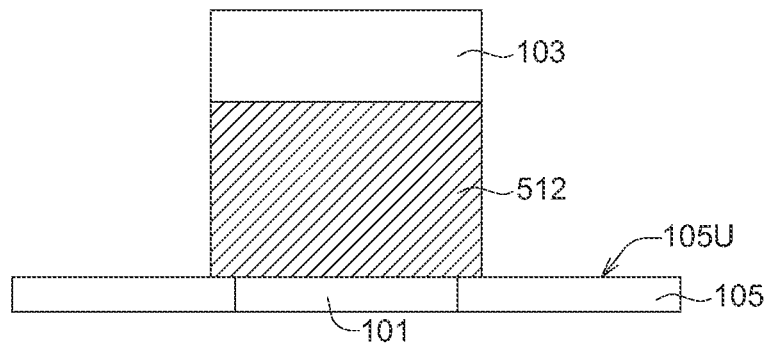

Referring to FIG. 6, an etching process is performed to the oxide material layer 512 and the hard mask layer 103. Part of the oxide material layer 512 and part of the hard mask layer 103 are removed. Part of upper surface 105U of the insulating layer 105 is exposed.

Figure 7:
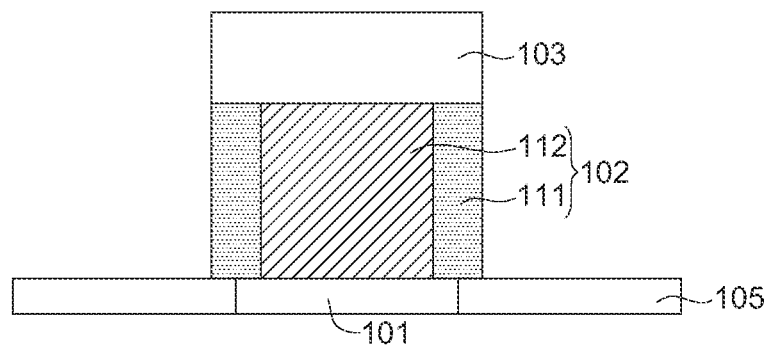

Referring to FIG. 7, an annealing step is performed to the oxide material layer 512 under an oxygen atmosphere, and the oxide material layer 512 is transformed into a memory structure 102. The memory structure 102 includes a pillar element 112 and a tubular element 111 surrounding the pillar element 112. During the annealing step, oxygen atoms may diffuse into the oxide material layer 512; an outer portion of the oxide material layer 512 reacts with oxygen with higher concentration and is transformed into the tubular element 111; an inner portion of the oxide material layer 512 reacts with oxygen with lower concentration and is transformed into the pillar element 112. The annealing step may be performed at high temperature.

The tubular element 111 may include oxide such as metal oxide. The pillar element 112 may include oxide such as metal oxide. The tubular element 111 and the pillar element 112 may include different materials. In an embodiment, the tubular element 111 has a constant oxygen content. The concentration distribution of the oxygen content of the tubular element 111 may be substantially uniform. In an embodiment, the pillar element 112 has a varied oxygen content. The concentration distribution of the oxygen content of the pillar element 112 may be non-uniform. For example, the oxygen content of the pillar element 112 may be gradually increased from a center of the pillar element 112 toward two opposite sides of the pillar element 112. For example, the oxygen content of the pillar element 112 may be gradually increased from a center of the pillar element 112 toward the tubular element 111. In an embodiment, an oxygen content of the pillar element 112 near the interface between the tubular element 111 and the pillar element 112 is substantially equal to the oxygen content of the tubular element 111. An oxygen content in the center of the pillar element 112 may be less than the oxygen content of the tubular element 111. The oxygen content of the tubular element 111 may be greater than that of the oxide material layer 512. An oxygen content in the center of the pillar element 112 may be substantially equal to the oxygen content of the oxide material layer 512. In an embodiment, the tubular element 111 includes tantalum pentoxide ($Ta_2O_5$), and the pillar element 112 includes tantalum oxide ($TaO_x$). In an embodiment, an electrical resistivity of the pillar element 112 may be between 1 mΩ·cm and 1 KΩ·cm.

Figure 8:
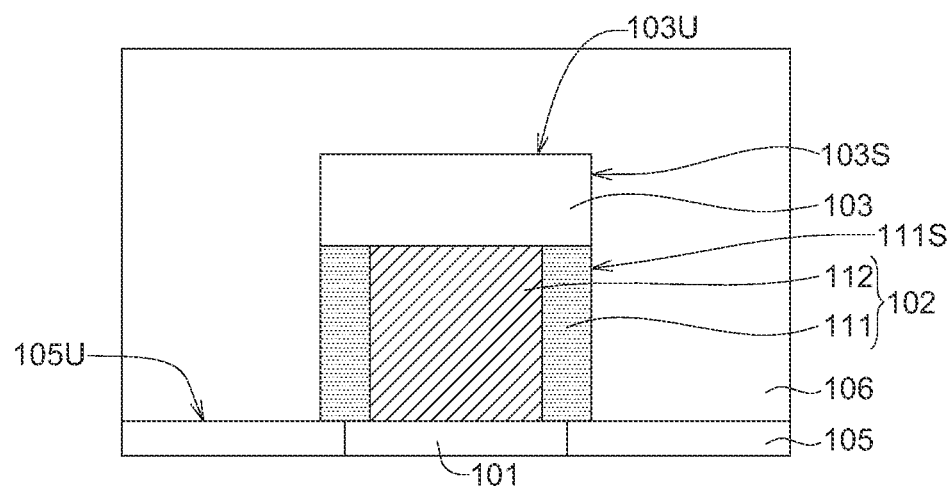

Referring to FIG. 8, a dielectric layer 106 is formed on the first electrode 101 and the insulating layer 105, for example, by a chemical vapor deposition process. The dielectric layer 106 may cover the exposed upper surface 105U of the insulating layer 105, the upper surface 103U of the hard mask layer 103, a sidewall 103S of the hard mask layer 103, and a sidewall 111S of the tubular element 111 of the memory structure 102. The dielectric layer 106 may directly contact the insulating layer 105, the hard mask layer 103 and the memory structure 102. The dielectric layer 106 may include a dielectric material such as an ultra low-k material (ULK) or silicon oxide (SiO).

Figure 9:
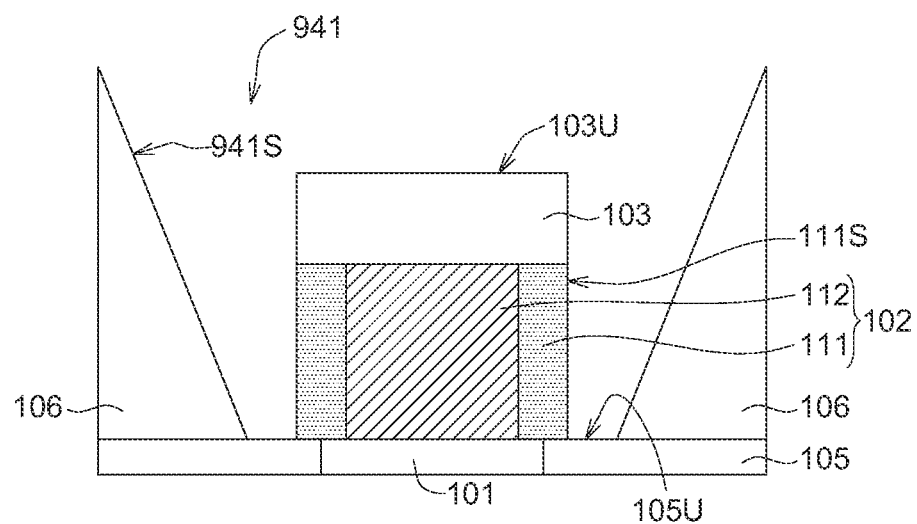

Referring to FIG. 9, an etching process is performed to the dielectric layer 106. Part of the dielectric layer 106 is removed. A hole 941 is formed. The upper surface 103U and the sidewall 103S of the hard mask layer 103, the sidewall 111S of the tubular element 111, and part of the upper surface 105U of the insulating layer 105 are exposed by the hole 941. The hole 941 may have a sidewall 941S inclined with respect to the normal direction of the upper surface 105U of the insulating layer 105. In an embodiment, a width of an opening of the hole 941 is greater than a width of a bottom of the hole 941.

Figure 10:
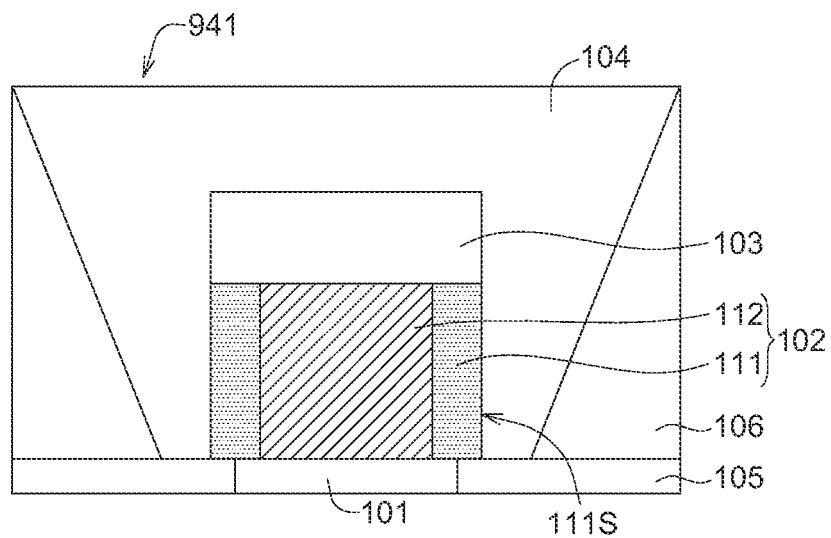

Referring to FIG. 10, a second electrode 104 is formed on the sidewall 111S of the tubular element 111. For example, the second electrode 104 can be formed in the hole 941 by a chemical vapor deposition process or a physical vapor deposition process. The second electrode 104 may surround the sidewall 111S of the tubular element 111. The second electrode 104 may include a conductive material, such as titanium, tantalum, copper, tungsten, platinum, iridium, etc. In an embodiment, the second electrode 104 includes copper. The first electrode 101 and the second electrode 104 may include the same or different materials. In an embodiment, through the method schematically illustrated in FIGS. 5-10, a resistive memory device 10 shown in FIG. 1 is provided.

The methods for manufacturing the resistive memory device 30 and the resistive memory device 40 according to other embodiments can be realized by the analogy. For example, the methods for manufacturing the resistive memory device 30 may include: performing an etching process to the dielectric layer to remove part of the dielectric layer to form a hole; the upper surface and the sidewall of the hard mask layer, and part of the sidewall of the tubular element are exposed by the hole. For example, the methods for manufacturing the resistive memory device 40 may include: after performing the method illustrated in FIGS. 5-10, a chemical-mechanical planarization (CMP) to the structure of FIG. 10 is performed to remove part of the second electrode on the upper surface of the hard mask layer.

According to embodiments of the present disclosure, the memory structure of the resistive memory device includes a tubular element and a pillar element surrounded by the tubular element. With such configuration, the effective operation area of the resistive memory device can be increased effectively, the endurance of the resistive memory device can be increased, and the resistive memory device can have a small size. Moreover, the pillar element of the memory structure of the present disclosure has an oxygen content gradually increased from a center of the pillar element toward two opposite sides of the pillar element, which can avoid a sudden drop of the resistance value distribution of the memory structure, improve or solve the problem of low current of the memory structure in a low resistance state, and increase the retention time of the memory device.

It is noted that the structures and methods as described above are provided for illustration. The disclosure is not limited to the configurations and procedures disclosed above. Other embodiments with different configurations of known elements can be applicable, and the exemplified structures could be adjusted and changed based on the actual needs of the practical applications. It is, of course, noted that the configurations of figures are depicted only for demonstration, not for limitation. Thus, it is known by people skilled in the art that the related elements and layers in a memory device, the shapes or positional relationship of the elements and the procedure details could be adjusted or changed according to the actual requirements and/or manufacturing steps of the practical applications.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A resistive memory device, comprising:
   a first electrode;
   a memory structure on the first electrode, wherein the memory structure comprises:
   a tubular element comprising oxide; and
   a pillar element comprising oxide, wherein the pillar element is surrounded by the tubular element, the tubular element and the pillar element comprise different materials; and
   a second electrode on the memory structure, wherein the second electrode is on at least a portion of a sidewall of the memory structure.

2. The resistive memory device according to claim 1, wherein the tubular element comprises tantalum pentoxide ($Ta_2O_5$), the pillar element comprises tantalum oxide ($TaO_x$).

3. The resistive memory device according to claim 1, wherein the first electrode is on a lower surface of the memory structure, the second electrode surrounds a sidewall of the tubular element.

4. The resistive memory device according to claim 1, further comprising a hard mask layer between the second electrode and the memory structure.

5. The resistive memory device according to claim 4, wherein the hard mask layer directly contacts an upper surface of the tubular element and an upper surface of the pillar element.

6. The resistive memory device according to claim 4, wherein the second electrode covers the portion of the sidewall of the memory structure, and another portion of the second electrode is above an upper surface of the memory structure.

7. The resistive memory device according to claim 1, wherein an upper surface of the tubular element is coplanar with and an upper surface of the pillar element.

8. The resistive memory device according to claim 1, wherein the first electrode directly contact the tubular element.

9. The resistive memory device according to claim 1, wherein the pillar element has a varied oxygen content.

10. The resistive memory device according to claim 1, wherein the pillar element has an oxygen content gradually increased from a center of the pillar element toward two opposite sides of the pillar element.

11. The resistive memory device according to claim 1, wherein the second electrode has a lower surface and an upper surface opposite to the lower surface, the lower surface has a first width, the upper surface has a second width, the first width of the lower surface is less than the second width of the upper surface.

12. The resistive memory device according to claim 1, wherein the first electrode has a width less than or equal to a width of the tubular element.

13. A method for manufacturing a resistive memory device, comprising:
   providing a first electrode;
   forming a tubular element and a pillar element on the first electrode through an annealing step, wherein the tubular element comprises oxide, the pillar element comprises oxide, the pillar element is surrounded by the tubular element, the tubular element and the pillar element comprise different materials; and forming a second electrode on the tubular element, wherein the step of forming the second electrode comprises: forming the second electrode on at least a portion of a sidewall of the tubular element.

14. The method according to claim 13, wherein the tubular element comprises tantalum pentoxide ($Ta_2O_5$), the pillar element comprises tantalum oxide ($TaO_x$).

15. The method according to claim 13, wherein the pillar element has an oxygen content gradually increased from a center of the pillar element toward two opposite sides of the pillar element.

16. The method according to claim 13, wherein the step of forming the tubular element and the pillar element comprises:

forming an oxide material layer on the first electrode;

performing the annealing step to the oxide material layer to let an outer portion of the oxide material layer transform into the tubular element and an inner portion of the oxide material layer transform into the pillar element.

17. The method according to claim 16, wherein the annealing step is performed under an oxygen atmosphere.

18. The method according to claim 16, further comprising:

forming a hard mask layer on the oxide material layer before the annealing step.

19. The method according to claim 18, wherein the step of forming the second electrode comprises:

forming the second electrode on the hard mask layer.

20. The method according to claim 13, wherein the second electrode surrounds the sidewall of the tubular element.

* * * * *